(12) United States Patent
Briggs et al.

(10) Patent No.: US 9,952,254 B1
(45) Date of Patent: Apr. 24, 2018

(54) GRIPS FOR TESTING OF ELECTRICAL CHARACTERISTICS OF A SPECIMEN UNDER A MECHANICAL LOAD

(71) Applicant: National Technology & Engineering Solutions of Sandia, LLC, Albuquerque, NM (US)

(72) Inventors: Timothy Briggs, Brentwood, CA (US); Bryan Loyola, San Jose, CA (US)

(73) Assignee: National Technology & Engineering Solutions of Sandia, LLC, Albuquerque, MN (US)

( * ) Notice: Subject to any disclaimer, the term of this patent is extended or adjusted under 35 U.S.C. 154(b) by 99 days.

(21) Appl. No.: 14/940,009

(22) Filed: Nov. 12, 2015

Related U.S. Application Data (60) Provisional application No. 62/079,113, filed on Nov. 13, 2014.

(51) Int. Cl.
*G01R 31/00* (2006.01)
*G01R 1/04* (2006.01)

(52) U.S. Cl.
CPC ........... *G01R 1/0416* (2013.01); *G01R 31/00* (2013.01)

(58) Field of Classification Search
CPC .. G01N 35/00; G01N 21/78; G01N 33/54386; G01N 2015/1006; G01N 21/253; G01N 21/6428; G01N 21/645; G01N 21/66; G01N 21/76; G01N 2201/062; G01N 2201/12; G01N 27/00; G01N 27/028; G01N 27/327; G01N 27/3276; G01N 27/3278; G01N 2800/326; G01N 2800/52; G01N 33/48721; G01N 33/48728; G01N 33/5014; G01N 33/5061; G01N 33/5073; G01N 33/54366; G01N 35/028; G01N 27/3272; G01R 31/28; G01R 1/02; G01R 1/22; G01R 31/362; H01R 9/09; F16B 2/20; G01L 1/26; G01L 5/228
See application file for complete search history.

(56) References Cited

U.S. PATENT DOCUMENTS

| | | | | |
|---|---|---|---|---|
| 4,969,828 A | * | 11/1990 | Bright | G01R 1/0475 439/248 |
| 5,196,028 A | * | 3/1993 | Portney | A61F 2/16 351/158 |
| 5,196,785 A | | 3/1993 | Douglas | |
| 5,412,314 A | * | 5/1995 | Fukunaga | G01R 31/2893 324/73.1 |
| 5,481,086 A | * | 1/1996 | Ferguson | F27B 14/10 219/385 |
| 5,610,512 A | | 3/1997 | Selcuk | |
| 5,959,215 A | * | 9/1999 | Ono | G01N 3/36 73/789 |

(Continued)

*Primary Examiner* — Vinh Nguyen
(74) *Attorney, Agent, or Firm* — Medley, Behrens & Lewis, LLC (57) ABSTRACT

Various technologies to facilitate coupled electrical and mechanical measurement of conductive materials are disclosed herein. A gripping device simultaneously holds a specimen in place and causes contact to be made between the specimen and a plurality of electrodes connected to an electrical measuring device. An electrical characteristic of the specimen is then measured while a mechanical load is applied to the specimen, and a relationship between the mechanical load and changes in the electrical characteristic can be identified.

20 Claims, 5 Drawing Sheets

(56) References Cited

U.S. PATENT DOCUMENTS

| | | |
|---|---|---|
| 6,911,814 B2 | 6/2005 | Miller et al. |
| 9,535,078 B2 * | 1/2017 | Dorman ................. G01N 35/00 |
| 2006/0180577 A1 * | 8/2006 | Lindeman ................ G01N 3/18 |
| | | 219/50 |
| 2014/0140367 A1 | 5/2014 | Dorman |
| 2015/0204904 A1 | 7/2015 | Beyeler et al. |

* cited by examiner

GRIPS FOR TESTING OF ELECTRICAL CHARACTERISTICS OF A SPECIMEN UNDER A MECHANICAL LOAD

RELATED APPLICATION

This application claims priority to U.S. Provisional Patent Application No. 62/079,113, filed on Nov. 13, 2014, and entitled "ELECTROMECHANICAL TESTING GRIPS", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Conductive materials are currently being developed for a broad range of applications in a wide variety of form factors, such as films, adhesives, and bulk materials. For example, such a conductive film can be applied to the exterior of an object to provide electromagnetic shielding, and a conductive adhesives can electrically connect two of these films together. The electrical characteristics of these materials often vary in response to exterior thermal conditions and mechanical loads. These variations can be used to design conductive materials that have desirable electrical performance under mechanical loading conditions. For example, a thin conductive film can be applied to the exterior of an aircraft component, and variations in resistivity of the film can be used to detect latent defects or points of failure in the component. Alternatively, the electrical properties of a conductive bulk material can be monitored for changes to indicate similar defects and potential failure, which is a focus of the field of structural health monitoring.

SUMMARY

The following is a brief summary of subject matter that is described in greater detail herein. This summary is not intended to be limiting as to the scope of the claims.

Described herein are various technologies related to coupled testing of electrical and mechanical characteristics and properties of conductive films. Simultaneous testing of mechanical and electrical behavior of a specimen allows materials to be designed that have known coupling effects between electrical and mechanical performance. In turn, this permits a measured electrical characteristic of the material to be used to determine a mechanical status of the material. For example, a change in resistivity of a conductive film can indicate a mechanical load applied to the conductive film, where the mechanical load is caused by the emergence of a mechanical defect in the underlying substrate to which the film is applied.

In an exemplary embodiment, an apparatus configured to test electrical characteristics of a thin conductive film (e.g., on the order of microns in thickness) under set mechanical loads includes gripping mechanisms that hold the film in place. The gripping mechanisms comprise electrodes that can be used for measuring electrical characteristics of the film. A (known) mechanical force and/or a known mechanical displacement can be applied to the film while the film is held in the gripping mechanisms, and an electrical characteristic is measured while the force is applied. Accordingly, electrical characteristics of the thin film under different load conditions can be determined and analyzed.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to coupled electrical and mechanical testing are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Additionally, as used herein, the term "exemplary" is intended to mean serving as an illustration or example of something, and is not intended to indicate a preference.

Various technologies pertaining to coupled electrical and mechanical measurements of conductive specimens, like thin carbon-nanotube-reinforced films, are described herein. Coupled electrical and mechanical measurements facilitate acquisition of mechanically-dependent electrical properties of conductive materials while known mechanical loads (force and/or displacement) are applied. Coupled electrical and mechanical testing allows researchers and engineers to generate profiles of relationships between electrical and mechanical characteristics (e.g., resistance of a material plotted against mechanical strain). These profiles can be used to design conductive materials, such as conductive films, with desirable electrical characteristics under mechanical loads.

Figure 1:
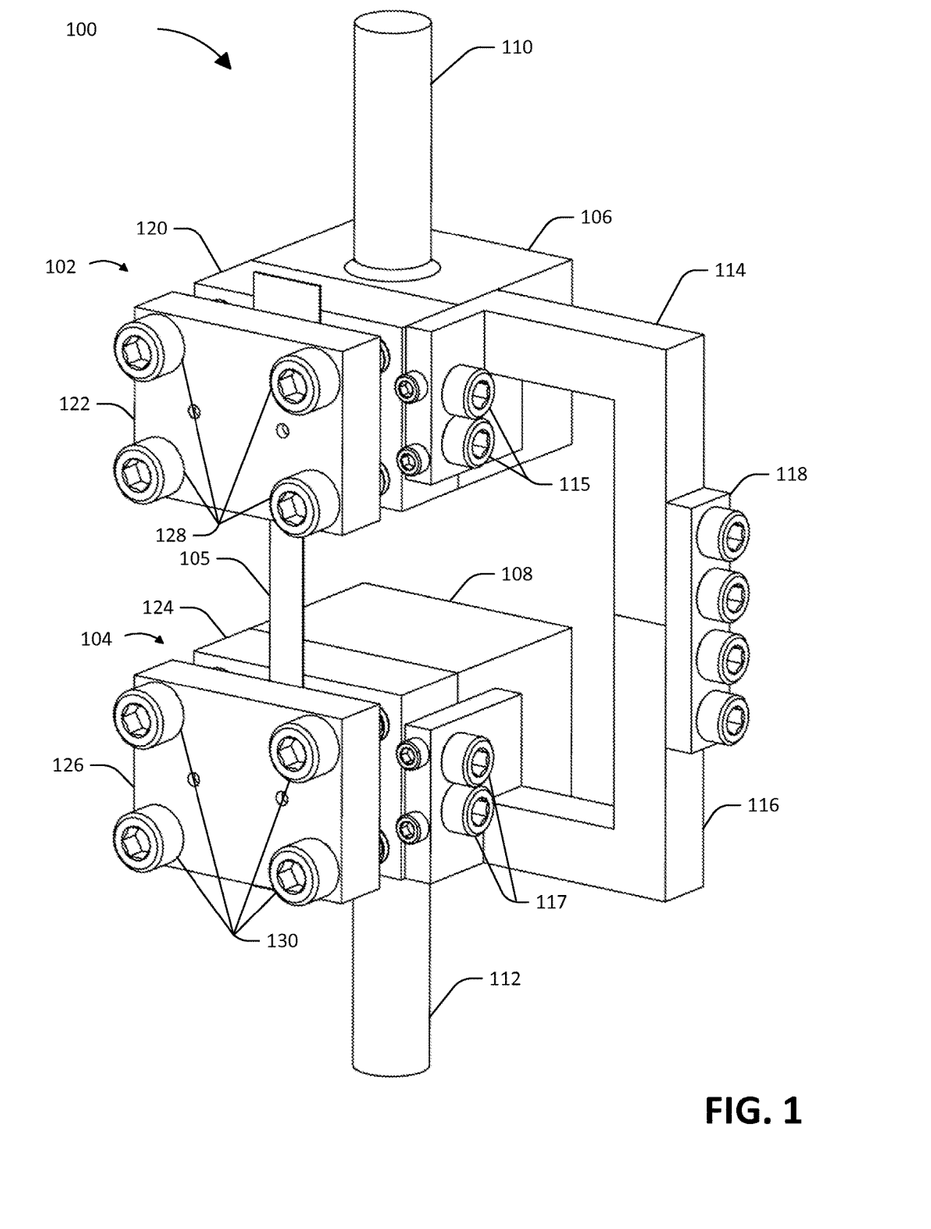
FIG. 1 is a diagram of an exemplary electromechanical testing device used to test coupled electrical and mechanical properties of a conductive material, such that mechanically-dependent electrical properties of the conductive material can be tested.

With reference to FIG. 1, an exemplary system 100 that facilitates coupled electrical and mechanical testing is illustrated. The system 100 includes two gripping mechanisms, or clamps, 102 and 104, that are used to hold a testing specimen 105, shown in FIG. 1 as a thin (e.g., between 100 microns to a half-inch thick), conductive material. In an example, the testing specimen 105 can be a conductive film, which can be flexible or rigid. The gripping mechanisms each include two members, where the specimen 105 can be held between the members of the gripping mechanism (as will be described in greater detail below). The gripping mechanisms 102 and 104 are removably attachable to two respective grip mounting brackets 106 and 108. The grip mounting brackets 106 and 108 are connected to actuator mounts 110 and 112 of a mechanical loading system. In the exemplary system 100, the mechanical loading system is configured to move the actuator mounts 110 and 112, and thereby change a relative position of the gripping mechanisms 102 and 104 to apply some mechanical force to the specimen 105.

The system 100 further comprises a first bracket arm 114 that is removably attached to the gripping mechanism 102 and a second bracket arm 116 removably attached to the gripping mechanism 104. The bracket arms 114 and 116 are coupled to the gripping mechanisms 102 and 104 by respective fasteners 115 and 117, such that the bracket arms 114 and 116 are attachable to and detachable from the gripping mechanisms 102 and 104. The bracket arms 114 and 116 are shown in FIG. 1 in a locked position, secured by a bracket locking member 118 that connects to the bracket arms 114 and 116 and holds them in a fixed relative position. As will be described in greater detail below with respect to FIGS. 2-3, when the bracket arms 114 and 116 are held fixed by the bracket locking member 118, the gripping mechanisms 102 and 104 (and the bracket arms 114 and 116) can be removed from the grip mounting brackets 106 and 108 while maintaining the fixed relative position of the gripping mechanisms 102 and 104. This permits the specimen 105 to be carefully positioned in the gripping mechanisms 102 and 104 prior to mounting the gripping mechanisms 102 and 104 in the grip mounting brackets 106 and 108.

Figure 2:
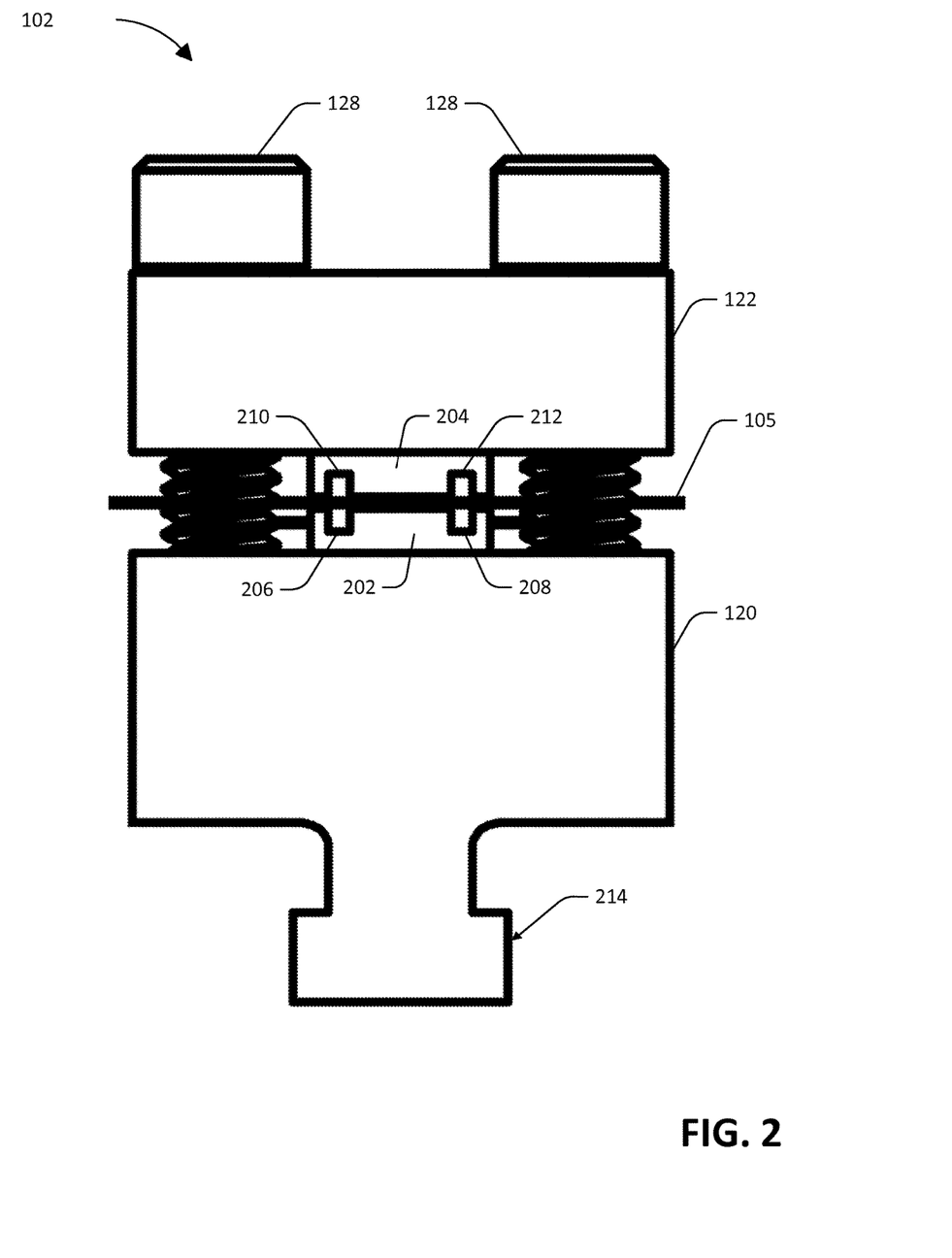
FIG. 2 is a diagram of an exemplary gripping mechanism in an electromechanical testing device.
Figure 3:
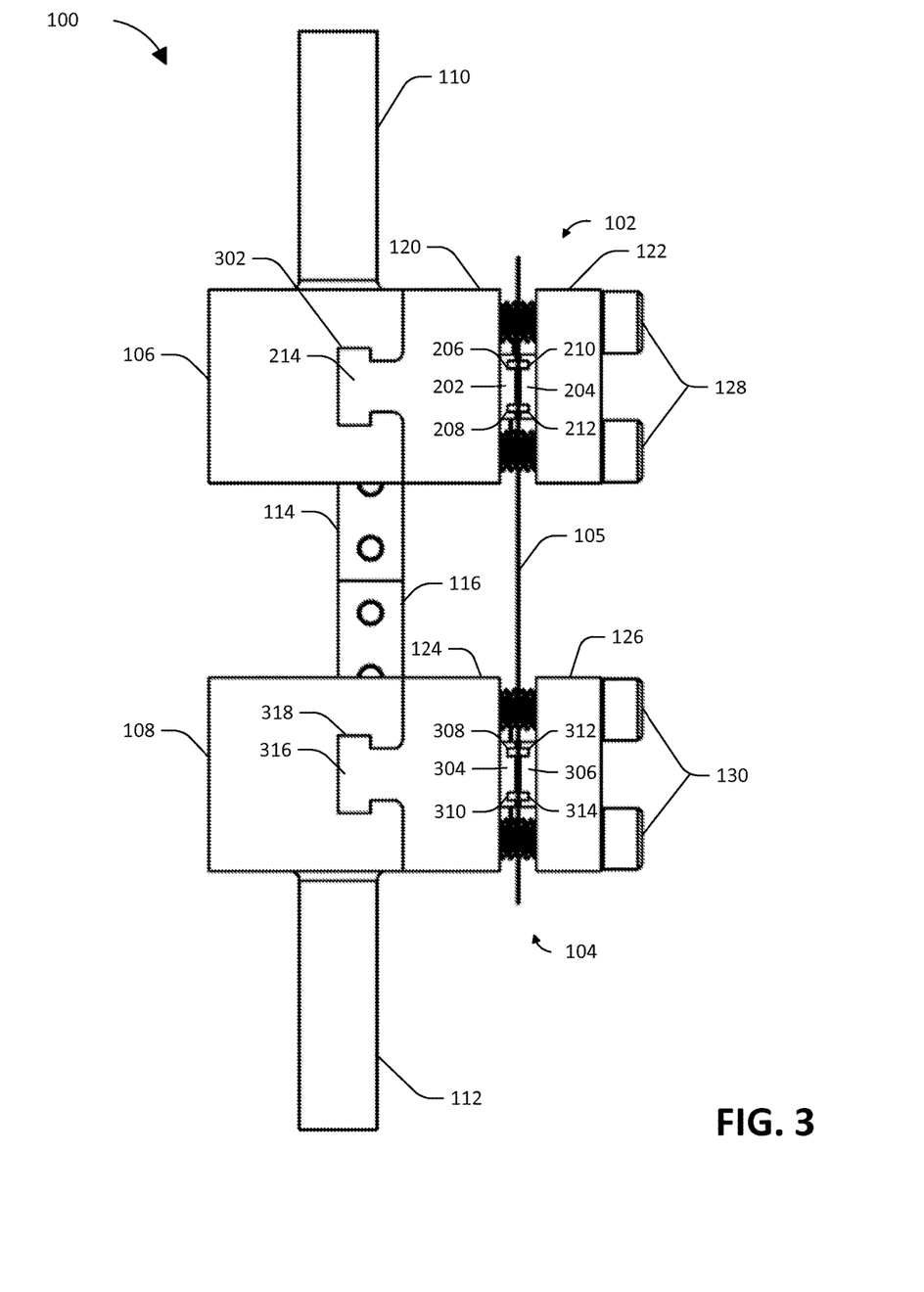
FIG. 3 is a side view of the exemplary electromechanical testing device of FIG. 1.

As indicated previously, the gripping mechanisms 102 and 104 further comprise respective bracket members 120-126. With more particularity, the gripping mechanism 102 comprises bracket members 120 and 122, while the gripping mechanism 104 comprises bracket members 124 and 126. Referring briefly to FIGS. 2 and 3, the bracket member 120 comprises gripping face 202 and the bracket member 122 comprises gripping face 204, which oppose one another and are parallel with one another. Similarly, the bracket member 124 comprises a gripping face 304 and the bracket member 126 comprises a gripping face 306, wherein the gripping faces 304 and 306 oppose one another and are parallel with one another. When the bracket arms 114 and 116 are held fixed by the bracket locking member 118, the gripping face 202 is approximately coplanar with the gripping face 304, and when gripping the specimen 105, the gripping face 204 is approximately coplanar with the gripping face 306.

Returning to FIG. 1, the bracket members 120-122 are coupled to one another by threaded fasteners 128, and the bracket members 124-126 are coupled to one another by threaded fasteners 130. The fasteners 128 can be used to move the bracket members 120-122 toward and away from one another, and the fasteners can be used to move the bracket members 124-126 toward and away from one another. Accordingly, the specimen 105 can be situated within the gripping mechanisms 102-104 when the bracket members 120-122 and 124-126 are apart, and the specimen 105 can be gripped and held in place by the gripping mechanisms 102-104 when the bracket members 120-122 and 124-126 are brought together.

Referring now to FIG. 2, a side view of the gripping mechanism 102 is shown that illustrates additional details of the gripping mechanism 102. The gripping mechanism 104 has substantially similar elements. The gripping mechanism 102 is configured to allow electrical characteristics of the specimen 105 to be measured while the specimen 105 is held by the gripping mechanism 102 (and optionally the gripping mechanism 104). The gripping mechanism 102 comprises the bracket members 120 and 122, gripping faces 202 and 204, and electrodes 206-212. The bracket member 120 includes a T-shaped protrusion 214 on an opposite side of the bracket member 120 as the gripping face 202. The protrusion 214 can be used to mate with a T-shaped slot 302 on the grip mounting bracket 106, as shown in FIG. 3, allowing the gripping mechanism 102 to be held securely in place at the grip mounting bracket 106 without requiring the use of fasteners. Additionally, the bracket arms 114 and 116 secured by the bracket locking member 118 can (optionally) be employed to ensure that there is rotational alignment (no initial torque on the specimen 105) between the grip mounting brackets 106 and 108 when the actuator mounts 110 and 112 are connected to a mechanical loading system.

The gripping faces 202 and 204 are attached to an interior side of the bracket members 120 and 122, respectively, so that the gripping faces 202 and 204 face one another. Thus, when the threaded fasteners 128 are tightened, the gripping mechanism 102 closes and the gripping faces 202 and 204 make contact with and hold the specimen 105 in place. In the exemplary gripping mechanism 102 shown, the gripping face 202 has electrodes 206 and 208 embedded therein, while the gripping face 204 has electrodes 210 and 212 embedded therein. The electrodes 206 and 208 are exposed at a contact surface of the gripping face 202, while the electrodes 210 and 212 are exposed at a contact surface of the gripping face 204. In an exemplary embodiment, the electrodes 206 and 208 are flush with the contact surface of the gripping face 202, and the electrodes 210 and 212 are flush with the contact surface of the gripping face 204. In another exemplary embodiment, one or more of the electrodes 206-212 can extend slightly beyond the contact surfaces of the gripping faces 202 and 204. In either embodiment, when the gripping faces 202 and 204 are moved to firmly grip the specimen 105, the electrodes 206-212 are in contact with the specimen and can be used as contact points for injecting current into the specimen 105 and/or measurement contact points for an electrical measurement device (e.g., a voltmeter, ammeter, ohmmeter, multimeter, etc.). In an alternative example, the electrodes 206-212, instead of being embedded in the gripping faces 202 and 204, can be attached to the surface of the gripping faces 202 and 204. In another example, the bracket members 120 and 122 can be composed of a conductive metal and the gripping faces 202 and 204 can be composed of an insulating material, wherein the insulating material of the gripping faces 202 and 204 provides electrical isolation of the specimen 105 from the remainder of the assembly 100. In yet more examples, the bracket members 120 and 122 can be non-conductive and the gripping faces 202 and 204 themselves can be conductors serving the function of electrodes, or the electrodes 206-212 can be attached to or embedded in the bracket members 120 and 122. In each of the exemplary configurations described, when the specimen 105 is held in place by the gripping mechanism 102, an electrical conductor makes contact with the specimen 105 so that current can be injected into the specimen 105 and measurements of electrical characteristics (e.g., voltage, current, resistance, conductance, etc.) can be made while the specimen 105 is held in place for mechanical loading. Thus, the system 100 permits measurement of electrical characteristics of the specimen 105 while known mechanical loads and deformations are applied.

Furthermore, while the exemplary gripping mechanism 102 is shown as having four electrodes 206-212, it is to be understood that any number of electrodes can be included to facilitate electrical measurement from any desirable contact points. Likewise, while the bracket members 120-122 and the gripping faces 202 and 204 are shown as having flat faces in order to grip the thin film specimen 105, the bracket members 120-126 and gripping faces 202-204 and 304-306 can have any shape that is suitable for gripping the specimen 105. While the specimen 105 has been described above as having a relatively thin profile, it is to be understood that the specimen 105 can have other shapes. For instance, the specimen 105 can be a rod with a circular cross section, and the gripping faces 202-204 and 304-306 can have a V-shaped groove suitable for gripping the round rod.

Referring now to FIG. 3, a side view of the exemplary device 100 is shown that illustrates certain additional features. The second gripping mechanism 104 is depicted, having gripping faces 304 and 306, electrodes 308-314, and a T-shaped protrusion 316 on the bracket member 124, similarly to gripping mechanism 102 as described above with respect to FIG. 2. The grip mounting brackets 106 and 108 are shown, the brackets 106 and 108 comprising the T-shaped slot 302 and a T-shaped slot 318 which, as described above with respect to FIG. 2 provide a means for the grip mounting brackets 106 and 108 to hold the gripping mechanisms 102 and 104 in place without requiring additional fasteners, and to allow rotational alignment when the actuator mounts 110 and 112 are connected to a mechanical loading system.

Further, the T-shaped slots 302, 318 and protrusions 214, 316 allow the gripping mechanisms 102 and 104 to be removed from the grip mounting brackets 106 and 108 while maintaining a fixed relative position of the gripping mechanisms 102 and 104. Referring back to FIG. 1, when the bracket arms 114 and 116 are locked in place by the bracket locking member 118 as shown, the gripping mechanisms 102 and 104 can be slid out of the slots 302 and 318 while maintaining the fixed relative position. In an example, the gripping mechanisms 102 and 104, connected to the bracket arms 114 and 116 by fasteners 110, can be removed from the grip mounting brackets 106 and 108 and laid on a flat surface to facilitate mounting or removal of the specimen 105. When the specimen 105 is mounted in a desirable position in the gripping mechanisms 102 and 104, the gripping mechanisms 102 and 104 can be slid back into the T-slots 302 and 318 of the grip mounting brackets 106 and 108, all while the gripping mechanisms 102 and 104 are held in the fixed relative position by the bracket arms 114 and 116.

The operation of the exemplary system 100 to perform coupled electrical and mechanical testing will now be described with respect to FIGS. 3 and 4. FIG. 3 depicts the thin-film specimen 105 that is held in place by the gripping mechanisms 102 and 104. Electrodes 206-212 are held in contact with the specimen 105 at the gripping faces 202 and 204, and the electrodes 308-314 are held in contact with the specimen 105 at the gripping faces 304 and 306.

Figure 4:
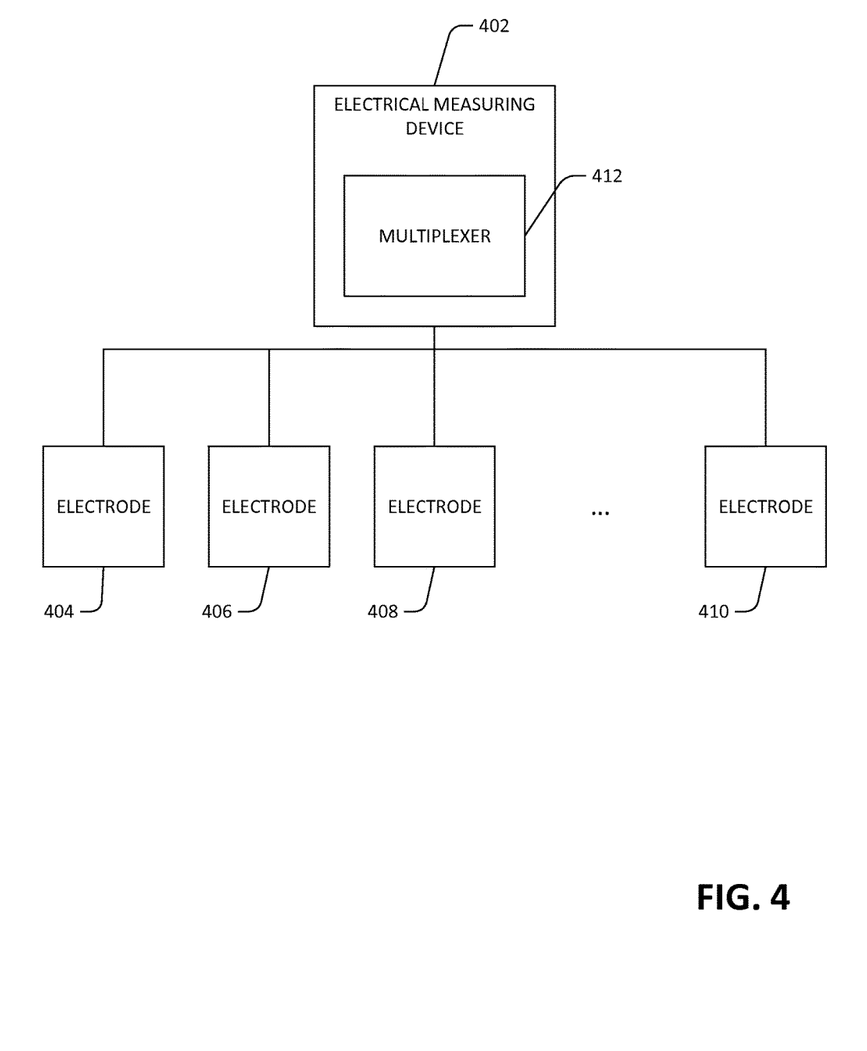
FIG. 4 is a functional block diagram of an exemplary electrical measurement system.

With reference now to FIG. 4, the configuration of an electrical measurement system is now described. An electrical measuring device 402 is connected to a plurality of electrodes 404-410. The electrical measuring device 402 is used to measure electrical characteristics of the specimen 105 with the electrodes 404-410 as contact points. An electrical characteristic can be a voltage, a resistance, a conductance, etc. The electrical measuring device 402 can include any or all of a voltmeter, an ammeter, an ohmmeter etc. The electrical measuring device 402 further includes a multiplexer 412 that allows the electrical measuring device 402 to select any electrodes to perform an electrical measurement between them. In an example, referring again to FIG. 3, cross-sectional resistance of the thin-film specimen 105 can be measured by the electrical measuring device 402 by causing the multiplexer 412 to select for measurement the electrodes 206 and 210, 208 and 212, 308 and 312, or 310 and 314. In another example, the electrical measuring device 402 is equipped to perform four-terminal Kelvin sensing. To perform four-terminal Kelvin sensing, the electrical measuring device 402 can cause a current to flow through the specimen 105 between two electrodes and measure a voltage between two additional electrodes, where the current also flows through the specimen between the two additional electrodes. Given the known current through the first pair of electrodes and the measured voltage between the second pair of electrodes, resistance between the second pair of electrodes can be calculated using Ohm's law. An advantage of four-terminal Kelvin sensing is that the calculated resistance does not include the resistance of the terminals used for measurement. In an example, the electrical measuring device 402 can cause a current to pass through electrodes 206 and 310 and can measure a voltage between electrodes 208 and 308 in order to perform the four-terminal Kelvin sensing measurement along the length of the specimen 105.

The system 100 can further be used to perform coupling of electrical and mechanical measurements by applying a mechanical force to the specimen 105 while electrical measurements are being made by the electrical measuring device 402. In the exemplary system 100, a known mechanical force can be applied by moving the actuator mounts 110 and 112. In an example, the actuator mounts 110 and 112 and the grip mounting brackets 106 and 108 can be moved away from one another, causing the gripping mechanisms 102 and 104 to move farther apart, thereby applying a tensile force along the length of the specimen 105. Electrical measurements made by the electrical measuring device 402 can be compared with the mechanical load and/or displacement applied to the specimen 105 in order to analyze the electrical response of the specimen based upon mechanical loading. While the configuration shown facilitates applying tensile and compressive forces to the specimen 105, it is to be understood that the actuator mounts 110 and 112 can be moved in a different fashion to apply a different force to the specimen. For example, the actuator mounts 110 and 112 can be relocated and moved to cause the gripping mechanisms 102 and 104 to rotate in opposite directions along a common axis, thereby applying a torsional torque to the specimen 105.

Furthermore, a mechanical force can be applied to the specimen 105 without moving the actuator mounts 110 and 112 or the gripping mechanisms 102 and 104. In an example, the specimen 105 can be cut, pierced, deformed, etc., without moving the actuator mounts 110 and 112.

The coupled electrical and mechanical measurements provided by the exemplary system 100 can be used to design materials and objects that have desirable electromechanical characteristics. In an example where the specimen is a thin carbon-nanotube-reinforced film, films can be developed based upon the coupled electrical and mechanical measurements that have known electrical characteristics under certain mechanical loading conditions. This can permit electrical sensors to identify mechanical faults or other problems in the conductive film on the basis of changes in electrical characteristics measured by those sensors.

Figure 5:
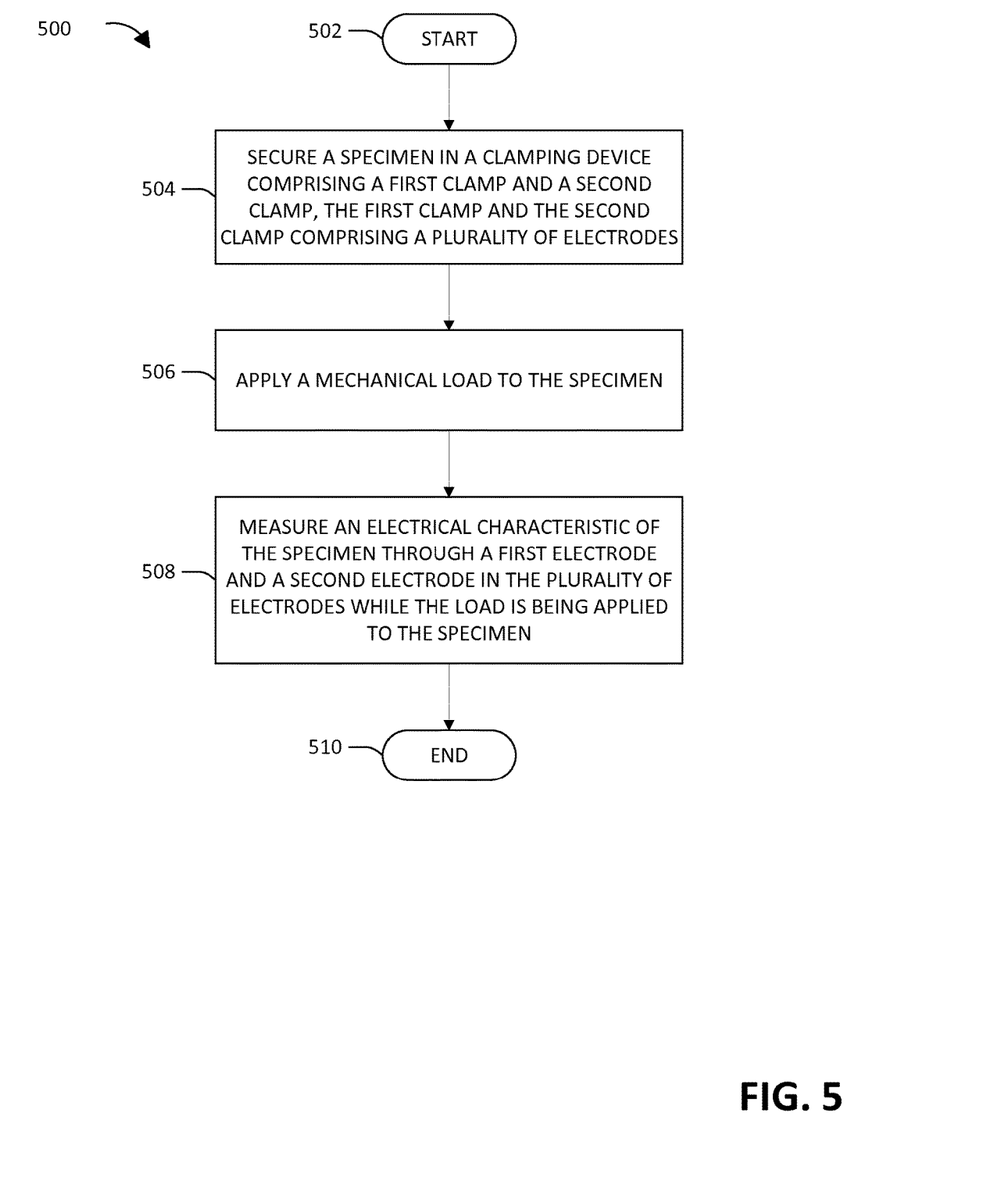
FIG. 5 is an exemplary methodology that facilitates coupled electrical and mechanical testing.

FIG. 5 illustrates an exemplary methodology relating to coupled electrical and mechanical testing of a specimen. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

The methodology 500 begins at 502, and at 504 a specimen is secured in a clamping device. The clamping device comprises a first clamp and a second clamp, the clamps comprising a plurality of electrodes. At 506, a mechanical force and/or displacement are applied to the specimen. The mechanical force can be any force that is desirable to be analyzed, or a combination of combined loading. In an example, the mechanical loading can be a torsional torque caused by a relative rotation of the first clamp and the second clamp. In another example, the mechanical force can be caused by piercing a portion of the specimen. At 508, an electrical characteristic of the specimen is measured through a first electrode and a second electrode in the plurality of electrodes while the mechanical force is being applied to the specimen. In an example, the electrical characteristic is a voltage, a resistance, a current, etc. The measurement of the electrical characteristic while the mechanical force is being applied allows a relationship between mechanical loading and electrical performance of the specimen to be identified. The methodology 500 ends at 510.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A device to facilitate electromechanical testing, the device comprising:
a first gripping mechanism that holds a first portion of a specimen, the first gripping mechanism comprises a first electrode that is in contact with the specimen;
a second gripping mechanism that holds a second portion of the specimen, the second gripping mechanism comprises a second electrode that is in contact with the specimen, the first and second gripping mechanisms movable with respect to one another;
a mechanical loading mechanism coupled to the first gripping mechanism, the mechanical loading mechanism configured to apply a mechanical load to the specimen; and
an electrical measuring device coupled to the first and second electrodes, the electrical measuring device configured to measure an electrical characteristic of the specimen while the mechanical load is applied to the gripping mechanism, the electrical measuring device measures the electrical characteristic based upon the first and second electrodes being in contact with the specimen.

2. The device of claim 1, wherein the specimen is a flexible conductive material.

3. The device of claim 1, further comprising:
a first grip mounting bracket having a first slot; and
a second grip mounting bracket having a second slot;
the first gripping mechanism comprises a first protrusion that mates with the first slot and the second gripping mechanism comprises a second protrusion that mates with the second slot, wherein the first gripping mechanism and the second gripping mechanism are coupled to the mechanical loading mechanism by the first grip mounting bracket and the second grip mounting bracket, respectively.

4. The device of claim 1, wherein:
the first gripping mechanism comprises a first gripping face and a second gripping face, the first gripping face and the second gripping face being movable toward and away from one another.

5. The device of claim 4, wherein the first electrode is embedded in the first gripping face.

6. The device of claim 5, wherein the first electrode has an exposed end that is flush with a contact surface of the first gripping face.

7. The device of claim 4, the first gripping mechanism further comprises:
a first bracket member, the first gripping face being attached to the first bracket member;
a second bracket member, the second gripping face being attached to the second bracket member; and
a third electrode that is exposed at a contact surface of the second gripping face, the third electrode in contact with the specimen.

8. The device of claim 7, wherein the first gripping face and the second gripping face are formed of an electrical insulator.

9. The device of claim 7, wherein the first and second bracket members are connected by a system of mechanical fasteners, such that when the fasteners are engaged the first and second gripping faces move toward or away from one another.

10. The device of claim 1, wherein the mechanical load is one of torsion, tension, or compression.

11. The device of claim 1, wherein the first gripping mechanism comprises a plurality of electrodes, and the electrical measuring device comprises a data acquisition system that is configured to select the first electrode from amongst the plurality of electrodes when measuring the electrical characteristic of the specimen.

12. The device of claim 1, further comprising:
a first bracket arm connected to the first gripping mechanism;
a second bracket arm connected to the second gripping mechanism; and a bracket locking member that, when connected to the first bracket arm and the second bracket arm, holds the first bracket arm at a fixed relative position to the second bracket arm.

13. A method for testing electrical characteristics of a specimen, the method comprising:
   securing a specimen in a clamping device, wherein securing the specimen in the clamping device comprises:
      holding a first portion of the specimen with a first clamp, the first clamp comprises a first electrode that is in contact with the specimen; and
      holding a second portion of the specimen with a second clamp, the second clamp comprises a second electrode that is in contact with the specimen, the second clamp movable with respect to the first clamp;
   applying at least one of a mechanical force or displacement to the specimen while the specimen is being held by the first clamp and the second clamp; and
   measuring an electrical characteristic of the specimen through the first electrode and the second electrode while the at least one of the mechanical force or displacement is being applied to the specimen.

14. The method according to claim 13, wherein the electrical characteristic is one of resistance, capacitance, inductance, or electrical impedance.

15. The method according to claim 13, at least four electrodes are in contact with the specimen while the specimen is being held by the first clamp and the second clamp, the at least four electrodes including the first electrode and the second electrode, and wherein measuring the electrical characteristic of the specimen comprises performing four-terminal Kelvin or impedance sensing with the at least four electrodes.

16. The method according to claim 15, wherein performing four-terminal Kelvin sensing comprises:
   causing an electrical current to flow in the specimen between the first electrode and the second electrode in the four electrodes;
   measuring a voltage of the specimen between a third electrode and a fourth electrode in the at least four electrodes, wherein the third electrode and the fourth electrode are within a region of current propagation established by the first electrode and the second electrode; and
   calculating an electrical characteristic of the specimen between the third electrode and the fourth electrode based upon the electrical current and the measured voltage.

17. The method according to claim 13, wherein applying the mechanical force comprises moving the first clamp relative to the second clamp.

18. The method according to claim 17, wherein moving the first clamp relative to the second clamp comprises at least one of:
   moving the first clamp and the second clamp away from one another such that a tensile force is applied to the specimen;
   moving the first clamp and the second clamp towards each other such that a compressive force is applied to the specimen; or
   rotating the first clamp relative to the second clamp such that a torque is applied to the specimen.

19. A device for testing electrical properties of a conductive material, the device comprising:
   a first grip holding a first portion of the conductive material, the first grip comprises a first electrode that is in contact with the conductive material;
   a second grip holding a second portion of the conductive material, the second grip comprises a second electrode that is in contact with the conductive material, the first grip movable relative to the second grip, wherein when a relative position of the grips changes a mechanical load is applied to the conductive material; and
   an electrical measuring device that is coupled to the first electrode and the second electrode, the electrical measuring device configured to measure an electrical characteristic of the conductive material while the mechanical load is applied, the electrical measuring device measures the electrical characteristic of the conductive material based upon the first electrode and the second electrode being in contact with the conductive material.

20. The device of claim 1, wherein the mechanical loading mechanism applies the mechanical load to the specimen by moving the first gripping mechanism with respect to the second gripping mechanism.

* * * * *